(12) United States Patent
Schwarz

(10) Patent No.: US 7,576,988 B2
(45) Date of Patent: Aug. 18, 2009

(54) ELECTRONIC DEVICE

(75) Inventor: Marcos Guilherme Schwarz, Joinville (BR)

(73) Assignee: Empresa Brasileira de Compressores S.A. - Embraco, Joinville - SC (BR)

( * ) Notice: Subject to any disclaimer, the term of this patent is extended or adjusted under 35 U.S.C. 154(b) by 0 days.

(21) Appl. No.: 11/464,434

(22) Filed: Aug. 14, 2006

(65) Prior Publication Data

US 2007/0127217 A1 Jun. 7, 2007

Related U.S. Application Data

(63) Continuation of application No. 10/250,989, filed on Nov. 12, 2003, now abandoned.

(51) Int. Cl.
*H05K 7/20* (2006.01)

(52) U.S. Cl. .................. 361/704; 361/707; 361/708; 361/720

(58) Field of Classification Search ......... 361/705–707, 361/819, 720, 704, 708; 257/724, 725, 687, 257/717

See application file for complete search history.

(56) References Cited

U.S. PATENT DOCUMENTS

| | | | | |
|---|---|---|---|---|
| 4,604,677 A | * | 8/1986 | Suzuki et al. | ............... 361/729 |
| 4,612,978 A | * | 9/1986 | Cutchaw | ................ 165/104.33 |
| 5,060,114 A | * | 10/1991 | Feinberg et al. | ............. 361/706 |
| 5,206,792 A | * | 4/1993 | Reynolds | .................... 361/719 |
| 5,208,733 A | | 5/1993 | Basanger | |
| 5,245,508 A | * | 9/1993 | Mizzi | ........................ 361/694 |
| 5,311,402 A | * | 5/1994 | Kobayashi et al. | .......... 361/760 |
| 5,319,244 A | * | 6/1994 | Papathomas et al. | ........ 257/701 |
| 5,321,582 A | | 6/1994 | Casperson | |
| 5,323,292 A | * | 6/1994 | Brzezinski | .................. 361/689 |
| 5,777,847 A | * | 7/1998 | Tokuno et al. | .............. 361/705 |
| 6,054,198 A | * | 4/2000 | Bunyan et al. | ............. 428/40.5 |
| 6,487,073 B2 | * | 11/2002 | McCullough et al. | ....... 361/687 |

FOREIGN PATENT DOCUMENTS

| | | |
|---|---|---|
| DE | 92 03 252 U | 5/1992 |
| DE | 9203252 * | 6/1992 |
| DE | 196 24 475 A1 | 1/1998 |
| WO | WO 0079856 A1 | 12/2000 |

OTHER PUBLICATIONS

International Search Report, EPO, mailed Jul. 2, 2002.

* cited by examiner

*Primary Examiner*—Anatoly Vortman
(74) *Attorney, Agent, or Firm*—Alston & Bird LLP

(57) ABSTRACT

An electronic device is described, which comprises an envelope comprising a closed chamber and a printed-circuit board. The printed-circuit board is positioned in the chamber and defines a dissipation chamber. The printed-circuit board comprises at least one electronic device positioned in the dissipation chamber. The dissipation chamber comprises a filler simultaneously in contact with the electronic component, the printed-circuit board and a dissipation film.

1 Claim, 1 Drawing Sheet

ELECTRONIC DEVICE

CROSS-REFERENCE TO RELATED APPLICATIONS

Figure 1:
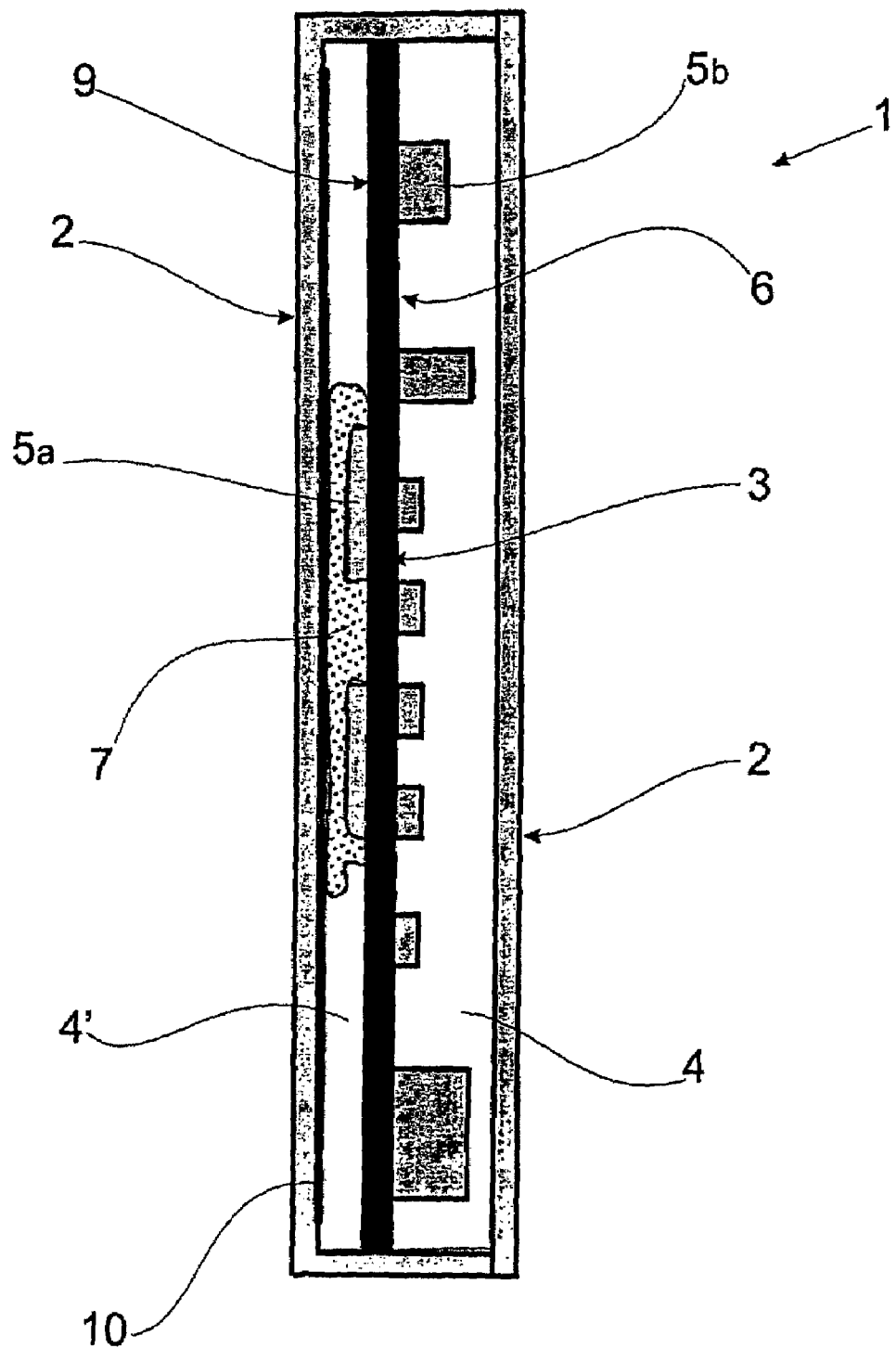

This patent application is a continuation and claims priority to U.S. patent application Ser. No. 10/250,989, filed Nov. 12, 2003 now abandoned, and entitled An Electronic Device.

BACKGROUND OF THE INVENTION

1. Field of the Invention

The present invention relates to an electronic device, simultaneously provided with heat dissipation medium and a heat insulation, used in motor-control circuits in general.

2. Description of the Prior Art

Circuits used for controlling motors in general, (including hermitic compressors for cooling), use electronic components that experience energy losses during operation resulting in heat generation by the components. There are various techniques of thermal coupling used today for providing transfer of this undesired heat to the environment, thereby avoiding overheating of the circuit, which may cause damage and/or reduction of the useful life of the electronic components.

The better the thermal coupling the better the transfer of heat between the electronic component, in which losses are generated, and the environment. So, the difference in temperature between the source of heat (electronic component with losses) and the environment, divided by the flow of transferred heat, represents the measure of the coupling in degrees Kelvin/Watt.

One of these techniques for providing a good thermal coupling of the electronic component with the environment consists in installing metallic elements thermally coupled to the electronic component, as for example, flaps. This metallic element has the function of a heat dissipator and is provided with a large area exposed to the surrounding air. In this way, it provides a good thermal coupling between the parts, significantly reducing the rise in temperature of the electronic component when the latter releases heat due to the Joule effect caused by the losses.

Although this is a quite effective and is a widely used way of providing a thermal coupling, it requires an attachment means, for example a screw, clip or the like, so that a physical coupling can be made between the electronic component and the dissipator, which requires a considerable physical space inside the equipment. Another drawback of this technique is that it requires added labor for mounting each component of the dissipator, entailing a high cost for this mounting process.

Another technique used for transferring heat between the electronic component and the environment are the so-called "heat tubes", which use cooling fluids that transfer heat by phase change. This is a very efficient way of transferring heat, but it requires a special construction for the dissipator that contains this cooling fluid, thus making it very expensive. In addition, it requires a geometric form as well as a physical space adequate for mounting the parts together.

With regard to hermetic compressors, there are also techniques such as placing the heat dissipator coupled to the electronic components and in direct contact with the surrounding air. This technique requires an opening in the box that protects the equipment, resulting in complications for project, manufacture and mounting, and requiring effective solutions to avoid penetration of fluids into the equipment and to guarantee insulation between the parts electrically connected to the circuit and the dissipator, especially because the latter is accessible from the outside and may represent a risk to safety.

As described in document WO 972729, it is known to couple the electronic components to the carcass of the compressor, as the carcass region is close to the cooling-gas suction tubing that is at a quite low temperature due to the exit of the evaporator. In spite of facilitating the heat transfer, this solution requires physical contact between the electronic components and the carcass of the compressor, in addition to an efficient insulation, demanding the use of devices adequate for fixation and elaborate mounting solutions.

Document U.S. Pat. No. 5,060,114 describes the heat transfer of an electronic device by conduction effect. In this way, a shapeable silicone plate is molded so as to enclose the electronic device, removing the heat generated by the latter. This configuration has the disadvantage of dissipating the heat generated by the assembly of electronic components only when the heat has already exceeded the envelope of this device, that is to say, the silicone plate is not in direct contact with the components, but rather with the envelope that contains them. In this way, one increases the barriers that prevent heat escape in contact with the components.

Document U.S. Pat. No. 5,208,733 describes an encapsulation comprising a heat dissipator that supports a structural element. The dissipator comprises a metallic plate of considerable thickness, arranged on the electronic components. A layer of polymeric film is placed, by means of a vacuum process, onto the electronic components, which are arranged on a printed-circuit board that in turn is fixed on the structural element. A substance composed of silicone in the form of a gel is added to the envelope so as to fill the space existing between the metallic plate and the components. However, since this substance does not have electric-insulation characteristics, it does not come into direct contact with the electronic components nor with the printed-circuit board, and is thus limited to the contour defined by the polymeric film. This construction requires various associated processes during the manufacture of this envelope, which increase its cost due to the need for added labor.

Another disadvantage is that, in addition to the thick metallic plate, the envelope has another protecting layer, which makes the release of heat to the environment difficult. In order to overcome this drawback, a cooling system and the presence of connectors are described, which increases the cost and the physical space occupied by the envelope.

BRIEF SUMMARY OF THE INVENTION

The objective of the present invention is to provide a good thermal coupling between the electronic components and the environment, by means of an electronic device having electrical insulation characteristics, which does not need openings for passing metallic components that are responsible for conducting heat to the environment.

It is also an objective of the present invention to eliminate the necessity to use screws or other means for keeping the electronic components in contact with the heat dissipator.

Another objective of this invention is to eliminate the necessity to install specific components for electric insulation between the energized parts of the components and the dissipator exposed to the environment.

A further objective of this invention is to provide effective and simple dissipation of the heat generated in the circuit, substantially reducing the size of the device, facilitating its construction, avoiding the need for mechanical precision and decreasing the manufacture costs.

The objectives of the present invention are achieved by means of an electronic device comprising an envelope provided with a closed chamber and a printed-circuit board, the latter being positioned in the chamber so as to define a dissipation chamber, the printed-circuit board comprising at least one electronic component positioned in the dissipation chamber, the dissipation chamber comprising a filling simultaneously in contact with the electronic component, the printed-circuit board and a dissipation film.

BRIEF DESCRIPTION OF THE SEVERAL VIEWS OF THE DRAWING(S)

The present invention will now be described in greater detail with reference to an embodiment represented in the drawings.

FIG. 1 shows a front view in cross-section of the electronic device of the present invention.

DETAILED DESCRIPTION OF THE INVENTION

According to a preferred embodiment and as can be seen in FIG. 1, the electronic device 1 is formed by an envelope 2, a closed chamber 4, a dissipation chamber 4', a printed-circuit board 3, electronic components 5a, 5b, a filling 7 and a dissipation film 10.

The envelope 2 is preferably formed from a rigid polymeric material and can assume different geometric shapes. The polymeric material imparts electric-insulation characteristics to the envelope 2.

The chamber 4 is delimited by the envelope 2 and represents the empty space formed inside the device 1. The printed-circuit board 3 provided with electronic components 5a, 5b, the filling 7 and the dissipation film 10 are inserted into the chamber 4.

The printed-circuit board 3 is positioned inside the device 1, so as to define a dissipation chamber 4', which comprises the electronic components 5a, which are associated to the first surface 9 of the plate 3. The plate 3 has also electronic components 5b, associated to its second surface 6, opposed to the first surface 9.

The electronic components 5a are power electronic components and, due to their characteristics, they are responsible for a relevant portion of the heat dissipated in the circuit. This heat is the result of the Joule effect, present here because of the losses existing in the components.

As to the components 5b, these do not present any loss sufficient to generate a considerable amount of heat in the circuit. These components are associated to the second surface 6 of the plate 3, opposed to the surface 9 of the plate 3.

The dissipation film 10 is arranged on the inner surface of the envelope 2 and opposite the first surface 9 of the plate 3. The dissipation film 10 is preferably comprised of a metallic material, preferably aluminum, of small thickness, for example, about 0.1 mm and embraces a larger area than the projected areas of the electronic components 5a, that is to say, the area occupied by the dissipation film is larger than that occupied by the sum of the areas of the outer surfaces of the components 5a, when these are projected, by way of calculation, onto the inner surface of the envelope 2. The dissipation film 10 is responsible for the transfer of heat to the inner surface of the envelope 2 and may be self-adhering. In this case, one applies a layer of adhesive material onto one of its surfaces, thus facilitating the application and fixation of this film 10 onto the inner surface of the envelope 2.

The filling 7 is arranged inside the dissipation chamber 4', simultaneously in contact with the perimeter of the electronic components 5a, parts of the first surface 9 of the plate 3 where there is no associated electronic component, as for example, printed-circuit fillets or tracks, and the dissipation film 10. The perimeters of the components 5b in contact with the filling 7 comprise the edges or portions of these components 5a which are above the surface 9 of the plate 3.

The medium 7 is constituted by gel, elastomer or electrically insulating paste and may be polymeric or not, containing or not containing heat-conducting fillers. The medium 7 should also be electrically insulating, since it is directly in contact with the tracks and terminals of the components of the printed circuit, where there are voltages and heat generation.

The medium 7 has elasticity and/or plasticity sufficient to accommodate variations in dimensions due to the thermal expansion undergone by the components 5a, by the printed-circuit plate 3 and by the envelope 2. In this way, it prevents the occurrence of cracks or detachment of the material of the filling medium 7 with respect to the components 5a or the tracks, from where one needs to remove heat, creating a clearance filled by air, which makes the passage of heat difficult. On the other hand, the medium 7 should not be very fluid, so that it will not flow and fail to fill the desired spaces.

When the heat-conducting fillers are present, they constitute heat-conducting and electrically-insulating solid materials in the form of powder or grains, as for example aluminum oxide or an oxide of another metal. The granulation of this material depends only upon the process of producing the filling medium 7 and of the physical stability desired for this medium 7 (either more fluid or more solid). For this purpose, it is preferable to use the material in the form of a powder.

This medium 7 has electric-insulation properties, while conducting, in a very effective way, the heat dissipated by the power electronic components 5a and their terminals as well as the heat generated by the tracks as far as the dissipation film 10. From the dissipation film 10 the heat passes through the envelope 2, being then transferred to the environment.

A preferred embodiment having been described, one should understand that the scope of the present invention embraces other possible variations, being limited only by the contents of the accompanying claims, which include the possible equivalents.

The invention claimed is:

1. An electronic device comprising:
   a casing comprising a rigid polymeric material forming a closed chamber;
   a printed-circuit board having tracks; said printed-circuit board being positioned in the chamber and thereby defining a dissipation chamber that is formed by the area between a surface of the printed-circuit board and the casing;
   at least one electronic component positioned in the dissipation chamber;
   a metallic dissipation film arranged on an internal surface of the casing within the dissipation chamber, the metallic dissipation film embracing an area larger than the projected area of the electronic components; and
   a filler arranged to be located in the chamber such that said filler simultaneously contacts directly with all portions of a perimeter of the electronic component that are within the dissipation chamber and above a portion of the electronic component that is engaged with the printed-circuit board, with the surface of the printed-circuit board, with the tracks of the printed-circuit board and the metallic dissipation film,
   wherein the filler is arranged to be located in the chamber in simultaneous contact with the surface of the printed-circuit board, with the tracks of the printed-circuit board, with the metallic dissipation film and with all portions of the perimeter of the electronic component that are above a portion of the electronic component that is engaged with the printed-circuit board while the filler is initially in a fluid state and without any film therebetween and without any material containing the filler.

* * * * *

UNITED STATES PATENT AND TRADEMARK OFFICE
CERTIFICATE OF CORRECTION

PATENT NO. : 7,576,988 B2  Page 1 of 1
APPLICATION NO. : 11/464434
DATED : August 18, 2009
INVENTOR(S) : Schwarz It is certified that error appears in the above-identified patent and that said Letters Patent is hereby corrected as shown below:

Title page,

Insert the following:

Item --(30) Foreign Application Priority Data

Jan. 11, 2001 (BR) ..................PI0100051-9--.

Signed and Sealed this

Fifth Day of January, 2010

David J. Kappos
*Director of the United States Patent and Trademark Office*